(12) United States Patent
Torikawa (10) Patent No.: US 10,648,081 B2
(45) Date of Patent: May 12, 2020

(54) METHOD OF BURYING SAMPLE TRENCH (71) Applicant: Hitachi High-Tech Science Corporation, Tokyo (JP)

(72) Inventor: Shota Torikawa, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 0 days.

(21) Appl. No.: 15/938,022

(22) Filed: Mar. 28, 2018

(65) Prior Publication Data

US 2018/0282870 A1 Oct. 4, 2018

(30) Foreign Application Priority Data

Mar. 28, 2017 (JP) ................................. 2017-062507

(51) Int. Cl.
*C23C 16/48* (2006.01)
*C23C 16/04* (2006.01)
*C23C 16/30* (2006.01)

(52) U.S. Cl.
CPC .......... *C23C 16/487* (2013.01); *C23C 16/045* (2013.01); *C23C 16/047* (2013.01); *C23C 16/30* (2013.01)

(58) Field of Classification Search
CPC ...... C23C 16/487; C23C 16/48; C23C 16/047
USPC ................................................ 427/596, 585
See application file for complete search history.

(56) References Cited

U.S. PATENT DOCUMENTS

| 5,270,552 A | 12/1993 | Ohnishi et al. |
| 6,926,935 B2 * | 8/2005 | Arjavac ................. C23C 16/047 427/585 |
| 2013/0209701 A1 * | 8/2013 | Suzuki .................. C23C 16/486 427/534 |
| 2013/0251914 A1 * | 9/2013 | Man ...................... C23C 16/486 427/551 |
| 2015/0340235 A1 * | 11/2015 | Lee ...................... H01L 21/0262 438/758 |

FOREIGN PATENT DOCUMENTS

| JP | 05-52721 | 3/1993 |
| JP | 2008-153239 | 3/2008 |

* cited by examiner

*Primary Examiner* — Dah-Wei D. Yuan
*Assistant Examiner* — Nga Leung V Law
(74) *Attorney, Agent, or Firm* — Stinson LLP (57) ABSTRACT

The invention provides a method of burying trenches of a sample comprises at least the steps of: from the sample having the trenches extending from one surface into a depth direction, cutting a sample piece of a small part including the trenches; and by irradiating an electron beam toward the inside of the trenches from a side surface extending along the depth direction of the sample piece and simultaneously injecting a compound gas into the inside of the trenches from openings on the side of the one surface of the trench, decomposing the compound gas with secondary electrons generated by irradiation of the electron beam and depositing constituents of the compound gas within the trenches. Therefore, the method can bury the trenches uniformly without generating cavities within the trenches even if the trenches of the sample piece have a high aspect ratio deep in a depth direction.

3 Claims, 7 Drawing Sheets

METHOD OF BURYING SAMPLE TRENCH

BACKGROUND

Technical Field

This invention relates to a method of burying trenches of a sample that can bury the trenches without generating a cavity within the trenches formed in the sample.

Related Art

In the related art, a device is known which extracts a sample piece which has been prepared by irradiating a sample with a charged particle beam including electrons or ions and processes the sample piece into a shape suitable for various processes such as observation, analysis, and measurement using a scanning electron microscope, a transmission electron microscope, and the like (for example, see Patent Documents No. 1 and No. 2 listed in below).

Among these sample pieces, in processing a sample piece having holes or grooves (hereinafter, sometimes referred to as trenches) with a charged particle beam, when an inner wall surface of the trench or its immediate vicinity becomes a subject matter to be analyzed, in order to prevent damages due to processing, for example, amorphization or curtain effect, it is common that burying of trenches is performed in advance before processing.

As means of burying trenches, for example, it is known that a resin or ink is applied to trenches to bury them.

Further, it is known that a decomposed product of a compound gas (hereinafter, sometimes referred to as a buried material) are deposited within trenches to bury them by a chemical vapor deposition (CVD) method using a charged particle beam.

PRIOR ART DOCUMENTS

[Patent Document No. 1] JP-A-1993-052721
[Patent Document No. 2] JP-A-2008-153239

SUMMARY OF THE INVENTION

However, the method of burying trenches by applying the aforementioned resin or ink is laborious and time consuming, since penetration of resin or ink having fluidity within fine trenches, drying after penetration, and the like are needed, and therefore, it is difficult to produce a sample piece having trenches into which burying has been efficiently completed. Further, since resin or ink as a buried material and the sample itself made of a single crystal, an inorganic compound, or the like are different materials of completely different properties, there is a problem in affinity and durability.

On the other hand, the method of burying trenches by the chemical vapor deposition (CVD), in trenches of a high aspect ratio of which depth is larger than an opening diameter, has a difficulty in burying the trenches with a buried material without a gap. That is, when the trenches of a high aspect ratio are buried by the CVD, the buried material is deposited in the vicinity of the opening portion before the bottom portion side of the trenches is buried with the buried material, and the buried material tends to form an overhang. As a result, the openings are closed in the state where cavities are formed in the trenches, and it is difficult to uniformly bury the trenches with the buried material without unevenness within the trenches.

This invention has been made in view of the circumstances described above. Accordingly, it is an object of the present invention to provide a method of burying trenches of a sample which is capable of uniformly bury trenches without causing cavities within the trenches even if a sample piece has trenches of a high aspect ratio deep in the depth direction.

In order to solve the above problems, an aspect of this embodiment provides a method of burying trenches of a sample as described below.

That is, a method of burying trenches of a sample of this invention is characterized in that it comprises at least the steps of: from the sample having the trenches extending from one surface into a depth direction, cutting a sample piece of a small part including the trenches; and by irradiating an electron beam toward the inside of the trenches from a side surface extending along the depth direction of the sample piece and at the same time injecting a compound gas into the inside of the trenches from openings on the side of the one surface of the trenches, decomposing the compound gas with secondary electrons generated by irradiation of the electron beam and depositing constituents of the compound gas within the trenches.

According to a method of burying trenches of a sample of this invention, secondary electrons are generated in the inside of the trenches by irradiating an electron beam toward the inside of the trenches, and the compound gas injected into the inside of the trenches is decomposed by the secondary electrons whereby the solid constituents can be deposited within the trenches. As a result, it is possible to prevent unevenness in the deposition of the constituents, such as the fact that the constituents are adhered to the vicinity of the openings before the bottom portion side of the trenches so that the vicinity of the openings is closed and cavities are formed within the trenches. Therefore, it is possible to uniformly bury the trenches with the constituents without causing cavities within the trenches.

Further, this invention is characterized in that in the depositing step, the constituents of the compound gas are sequentially deposited toward the openings from the bottom of the trenches by scanning the electron beam toward the openings from the bottom of the trenches.

Furthermore, this invention is characterized in that in the depositing step, an acceleration voltage of the electron beam is varied in accordance with a distance from the side surface of the sample piece to an inner wall surface of the trench.

Effect of the Invention

According to this invention, it is possible to provide a method of burying trenches of a sample which is capable of uniformly burying trenches without causing cavities within the trenches even if a sample piece has trenches of a high aspect ratio deep in the depth direction.

DESCRIPTION OF EMBODIMENTS OF THE INVENTION

Hereinafter, a method of burying trenches of a sample, which is an embodiment of the present invention, will be described with reference to the drawings. Each of embodiments described below is only for the purpose of better understanding of the gist of the present invention, and the present invention is not limited thereto unless otherwise specified. It should be noted that some of main parts of this invention in the drawings used in the following description are enlarged, for the sake of convenience, for easy understanding of the present invention, and it cannot be said that dimensional ratios and the like of respective constituents are the same as the actual ones.

In the following description, the trenches include holes or grooves of various shapes such as holes of cylindrical shape, rectangular tubular shape, or triangular tubular shape, long grooves extending in one direction, conical holes that narrow in a truncated cone shape from the opening side toward the bottom surface, or trapezoidal holes extending toward the bottom surface from the opening side wherein the holes or grooves are formed in a sample or a sample piece.

Hereinafter, a charged particle beam apparatus to which a method of burying trenches of a sample according to an embodiment of the present invention can be applied will be described with reference to the accompanying drawings.

Figure 1:
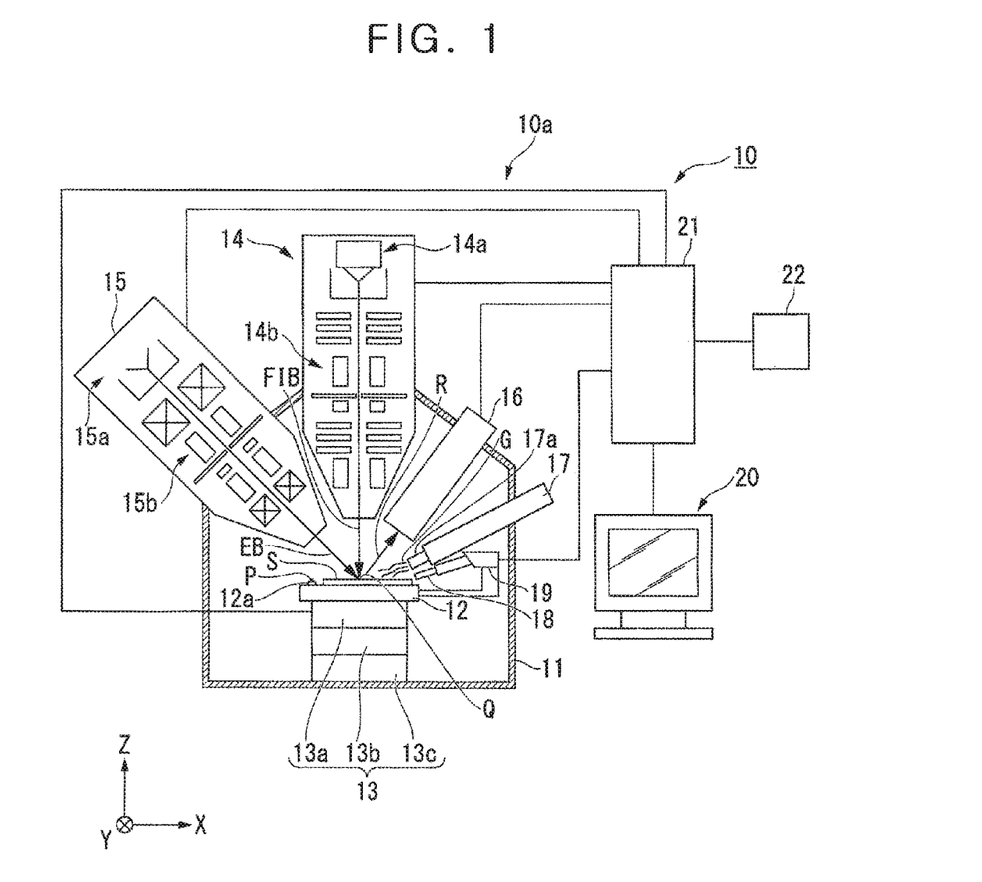
FIG. 1 is a diagram illustrating a configuration of a charged particle beam apparatus according to an embodiment of the present invention.

FIG. 1 is a diagram illustrating a configuration of a charged particle beam apparatus according to an embodiment of the present invention.

As illustrated in FIG. 1, the charged particle beam apparatus 10 according to the embodiment of the present invention includes a sample chamber 11 that is capable to keep the inside thereof in a vacuum state, a stage 12 that can fix a sample S and a sample piece holder P in the sample chamber 11, and a stage driving mechanism 13 that drives the stage 12.

The charged particle beam apparatus 10 includes a focused ion beam irradiation optical system 14 that irradiates an irradiation target in a predetermined irradiation area (that is, scanning range) in the sample chamber 11 with a focused ion beam (FIB).

The charged particle beam apparatus 10 includes an electron beam irradiation optical system 15 that irradiates an irradiation target in a predetermined irradiation area in the sample chamber 11 with an electron beam (EB).

The charged particle beam apparatus 10 includes a secondary electron detector 16 that detects secondary electrons R generated from the irradiation target by irradiation with a focused ion beam or an electron beam.

The charged particle beam apparatus 10 includes a gas supply unit 17 that supplies gas G such as etching gas or compound gas to the surface of the irradiation target. The gas supply unit 17 includes, for example, a nozzle 17a with an outer diameter of about 200 μm or the like.

The charged particle beam apparatus 10 includes a needle 18 that extracts a minute sample piece Q from a sample S fixed to the stage 12 and holds and transfers the sample piece Q to the sample piece holder P, and a needle driving mechanism 19 that drives the needle 18 to carry the sample piece Q. The needle 18 and the needle driving mechanism 19 may also be collectively referred to as a sample piece transferring unit.

The charged particle beam apparatus 10 includes a display device 20 that displays image data and the like based on the secondary charged particles R detected by the detector 16, a computer 21, and an input device 22.

Examples of the irradiation target of the focused ion beam irradiation optical system 14 and the electron beam irradiation optical system 15 include the sample S fixed to the stage 12, the sample piece Q, and the needle 18 or the sample piece holder P which is present in the irradiation area.

The charged particle beam apparatus 10 according to this embodiment performs imaging of an irradiated part, a variety of processing (such as excavation and trimming) based on sputtering, forming of a deposition layer, and the like by irradiating the surface of an irradiation target with a focused ion beam while scanning.

The charged particle beam apparatus 10 can perform a processing of forming a sample piece Q which is a small part of the sample S and cut out from the sample S, in order to perform transmission observation using a transmission electron microscope or observation using an electron beam.

The charged particle beam apparatus 10 can process the sample piece Q transferred to the sample piece holder P to a thin film with a desired thickness (for example, 5 nm to 100 nm) suitable for transmission observation using a transmission electron microscope. The charged particle beam apparatus 10 can observe the surface of an irradiation target by irradiating the surface of the irradiation target such as the sample piece Q and the needle 18 with a focused ion beam or an electron beam while scanning.

Figure 2A:
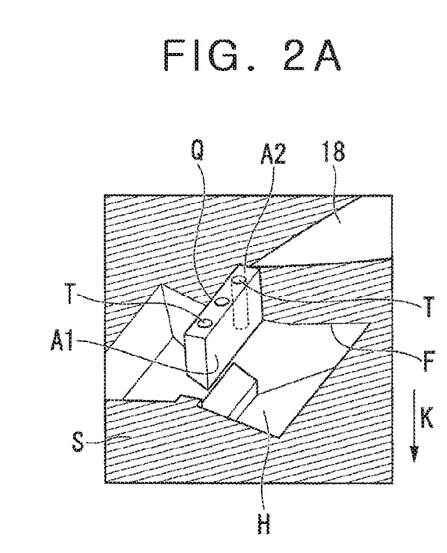
FIG. 2A is a perspective view showing a sample piece Q immediately before the sample piece is extracted from the sample S and FIG. 2B is an enlarged cross-sectional view of trench portions of the sample piece.
Figure 2B:
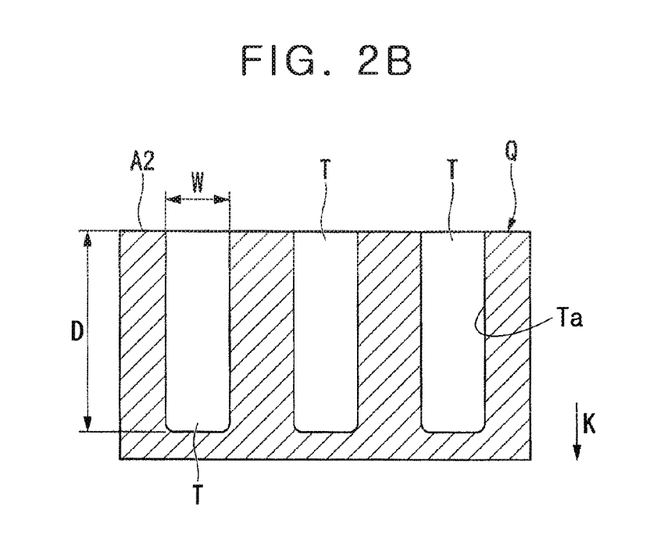

FIG. 2A is a perspective view showing a sample piece Q immediately before the sample piece is extracted from the sample S, where the sample piece is formed by irradiating the surface (the hatched portion) of the sample S with a focused ion beam in the charged particle beam apparatus shown in FIG. 1 and FIG. 2B is an enlarged cross-sectional view of trench portions of the sample piece. Reference sign F denotes a processing frame to be processed by a focused ion beam, that is, a scanning range of the focused ion beam, and the inside (white part) thereof represents a processing area H which is sputtered and excavated by irradiation with the focused ion beam.

The sample S is provided with a plurality of trenches T extending in the depth direction K from one surface A2, three cylindrical holes in this embodiment. The sample piece Q of the present embodiment is formed by cutting out a small part including the trenches T from the sample S. The trench T has a high aspect ratio such as an aspect ratio of an opening diameter W and a depth D of 1:3 or more, for example, 1:10 in the present embodiment.

When forming the sample piece Q wherein an inner wall surface Ta of the trench T or its immediate vicinity becomes a subject matter to be analyzed, the trenches T are buried with a buried material in order to prevent amorphization or curtain effect. The burying of the trenches T will be described later in detail.

The sample piece Q has a size in the length direction of, for example, about 10 μm, 15 μm, or 20 μm and a width (thickness) of, for example, about 500 nm, 1 μm, 2 μm, or 3 μm. Then, the opening diameter W of the trench T is about 10 nm~about 200 nm, and the depth D is about 100 nm~about 40 μm.

Referring to FIG. 1 again, the sample chamber 11 is configured to exhaust the inside thereof using an exhauster (not illustrated) up to a desired vacuum state and to maintain the desired vacuum state.

The stage 12 holds the sample S. The stage 12 includes a holder support 12a that holds the sample piece holder P. The holder support 12a may have a structure on which plural sample piece holders P can be mounted.

Figure 3:
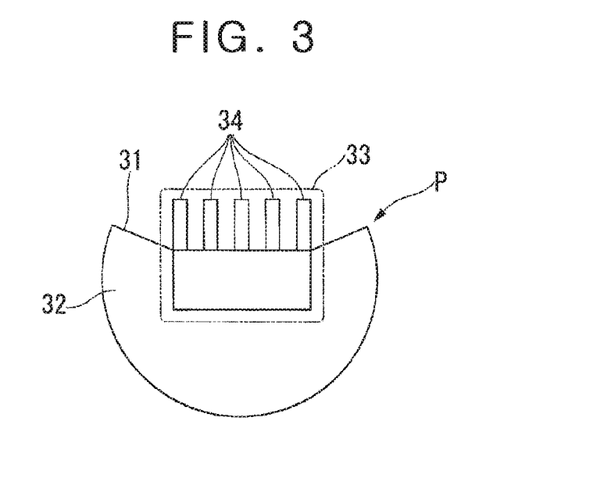
FIG. 3 is a plan view of a sample piece holder.
Figure 4:
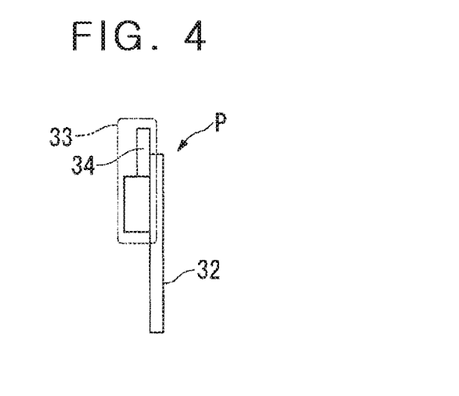
FIG. 4 is a side view of a sample piece holder.

FIG. 3 is a plan view of the sample piece holder P and FIG. 4 is a side view thereof. The sample piece holder P includes a semicircular plate-like base 32 having a cutout portion 31 and a sample mount 33 which is fixed to the cutout portion 31. For example, the base 32 is formed in a circular plate shape with a diameter of 3 mm and a thickness of 50 μm out of metal.

The sample mount 33 is formed, for example, from a silicon wafer through a semiconductor manufacturing process and is bonded to the cutout portion 31 with a conductive adhesive. The sample mount 33 has a comb-teeth shape and includes a plurality of pillar-shaped portions (for example, five, ten, fifteen, or twenty; hereinafter, also referred to as pillars) 34 which are disposed to be separated from each other and to protrude and to which the sample pieces Q are transferred.

By setting the width of each of the pillar-shaped portions 34 to be different from each other, the sample pieces Q transferred to the pillar-shaped portions 34 and images of the pillar-shaped portions 34 can be correlated with each other and can be stored in the computer 21 in correlation with the corresponding sample piece holder P. Accordingly, even when plural sample pieces Q are prepared from a single sample S, the sample pieces can be recognized without any mistake and the sample pieces Q and the extracted positions on the sample S can be correctly correlated with each other in analysis using a subsequent transmission electron microscope. Each pillar-shaped portion 34 is formed, for example, to have a thickness of a tip of equal to or less than 10 μm or equal to or less than 5 μm, and holds a sample piece Q attached to the tip portion thereof.

The stage driving mechanism 13 is accommodated in the sample chamber 11 in a state in which the stage driving mechanism 13 is connected to the stage 12, and displaces the stage 12 about a predetermined axis in accordance with a control signal output from the computer 21. The stage driving mechanism 13 includes at least a driving mechanism 13a that moves the stage 12 in parallel to an X axis and a Y axis which are parallel to a horizontal plane and perpendicular to each other and a Z axis which is parallel to the vertical direction perpendicular to the X axis and the Y axis. The stage driving mechanism 13 includes a tiling mechanism 13b that tilts the stage 12 about the X axis or the Y axis and a rotating mechanism 13c that rotates the stage 12 about the Z axis.

The focused ion beam irradiation optical system 14 is fixed to the sample chamber 11 in a state in which a beam emitting unit (not illustrated) in the sample chamber 11 faces the stage 12 at a position above the stage 12 in the irradiation area in the vertical direction and an optical axis thereof is parallel to the vertical direction. Accordingly, an irradiation target such as a sample S and a sample piece Q which are fixed to the stage 12 and a needle 18 which is present in the irradiation area can be irradiated with a focused ion beam downward from an upper side in the vertical direction.

The focused ion beam irradiation optical system 14 includes an ion source 14a that generates ions and an ion optical system 14b that focuses and deflects the ions emitted from the ion source 14a. The ion source 14a and the ion optical system 14b are controlled in accordance with a control signal output from the computer 21 and an irradiation position, irradiation conditions, and the like of the focused ion beam are controlled by the computer 21. Examples of the ion source 14a include a liquid metal ion source, a plasma ion source, and a gas field ionization ion source which use liquid gallium or the like. The ion optical system 14b includes, for example, a first electrostatic lens such as a condenser lens, an electrostatic deflector, and a second electrostatic lens such as an objective lens.

The electron beam irradiation optical system 15 is fixed in the sample chamber 11 in a state in which a beam emitting unit (not illustrated) in the sample chamber 11 faces the stage 12 from an tilt direction which is tilted by a predetermined angle (for example, 60°) about the vertical direction of the stage 12 in the irradiation area and an optical axis thereof is parallel to the tilt direction. Accordingly, an irradiation target such as a sample S and a sample piece Q which are fixed to the stage 12 and a needle 18 which is present in the irradiation area can be irradiated with an electron beam downward from an upper side in the tilt direction.

The electron beam irradiation optical system 15 includes an electron source 15a that generates electrons and an electron optical system 15b that focuses and deflects the electrons emitted from the electron source 15a. The electron source 15a and the electron optical system 15b are controlled in accordance with a control signal output from the computer 21 and an irradiation position, irradiation conditions, and the like of the electron beam are controlled by the computer 21. The electron optical system 15b includes, for example, an electromagnetic lens, a deflector, and the like.

The arrangement of the focused ion beam irradiation optical system 14 and the electron beam irradiation optical system 15 is not limited to the configuration of FIG. 1. The focused ion beam irradiation optical system 14 and the electron beam irradiation optical system 15 may be exchanged with each other in position, the electron beam irradiation optical system 15 may be arranged in the vertical direction, and the focused ion beam irradiation optical system 14 may be arranged in the tilt direction which is tilted by a predetermined angle about the vertical direction.

The secondary electron detector 16 detects intensity (that is, an amount) of secondary electrons (secondary electrons and secondary ions) R emitted from the irradiation target when the irradiation target such as a sample S and a needle 18 is irradiated with a focused ion beam or an electron beam, and outputs information of the amount of secondary electrons R detected. The secondary electron detector 16 is disposed at a position at which the amount of secondary electrons R can be detected in the sample chamber 11, for example, a position obliquely above the irradiation target such as the sample S in the irradiation area, and is fixed to the sample chamber 11.

The gas supply unit 17 is fixed to the sample chamber 11, includes a gas injecting outlet (also referred to as a nozzle) in the sample chamber 11, and is disposed to face the stage 12. The gas supply unit 17 can supply the sample S with etching gas G for selectively promoting etching of the sample S with a focused ion beam FIB depending on the material of the sample S and compound gas (deposition gas) G for forming deposits toward the sample S or the sample piece Q.

For example, by supplying a sample S with etching gas such as xenon fluoride for a silicon-based sample S and water for an organic sample S along with irradiation with a focused ion beam FIB, the etching can be promoted selectively.

For example, by supplying a sample S with compound gas G containing platinum, carbon, tungsten, or the like along with irradiation with a focused ion beam, constituents (solid components) decomposed from the compound gas can be deposited on the surface of the sample S.

Further, by supplying a sample S with compound gas G along with irradiation with an electron beam EB, the compound gas G is decomposed by secondary electrons generated when the electron beam EB is incident on the sample piece Q and solid constituents which are components of the compound gas G can be deposited on the sample piece Q.

Specific examples of the compound gas G (deposition gas) include phenanthrene, or naphthalene as the gas containing carbon, trimethyl ethylcyclopentadienyl platinum as the gas containing platinum, and tungsten hexacarbonyl as the gas containing tungsten.

The needle driving mechanism 19 is accommodated in the sample chamber 11 in a state in which the needle 18 is connected thereto, and displaces the needle 18 in accordance with a control signal output from the computer 21. The needle driving mechanism 19 is integrally formed with the stage 12 and moves integrally with the stage 12, for example, when the stage 12 rotates about the tilt axis (that is, the X axis or the Y axis) by the tilting mechanism 13b. The needle driving mechanism 19 includes a driving mechanism (not illustrated) that moves the needle 18 in parallel to each of three-dimensional coordinate axes and a rotating mechanism (not illustrated) that rotates the needle 18 around the central axis of the needle 18. These three-dimensional coordinate axes are independent of the orthogonal three-axis coordinate system of the sample stage, and an orthogonal three-axis coordinate system based on two-dimensional coordinate axes parallel to the surface of the stage 12 and this coordinate system is tilted and rotated when the surface of the stage 12 is in a tilted state and in a rotating state.

The computer 21 is disposed outside the sample chamber 11 and is connected to a display device 20 and an input device 22 such as a mouse or a keyboard that outputs a signal corresponding to an input operation from an operator.

The computer 21 collectively controls the operations of the charged particle beam apparatus 10 based on a signal output from the input device 22, a signal generated through a predetermined automatic operation control process, or the like.

The computer 21 converts an amount of secondary electrons R detected by the secondary electron detector 16 into a luminance signal correlated with the irradiation position while scanning the irradiation position with the charged particle beam and generates image data indicating the shape of the irradiation target by a two-dimensional position distribution of the amount of secondary electrons R detected.

Next, using the charged particle beam apparatus described above, a method of preparing a TEM observation sample piece, including the method of burying trenches of a sample of the present invention will be described below.

First, preparation for producing the sample piece Q is performed. That is, in the inside of the sample chamber 11, a sample S is placed and fixed on the holder support 12a of the stage 12, and the sample piece holder P to fix sample pieces Q to be produced later is fixed. Then, the sample chamber 11 is closed and exhausted by an exhauster (not illustrated) to reduce the pressure inside the sample chamber 11 to a predetermined degree of vacuum.

Figure 5:
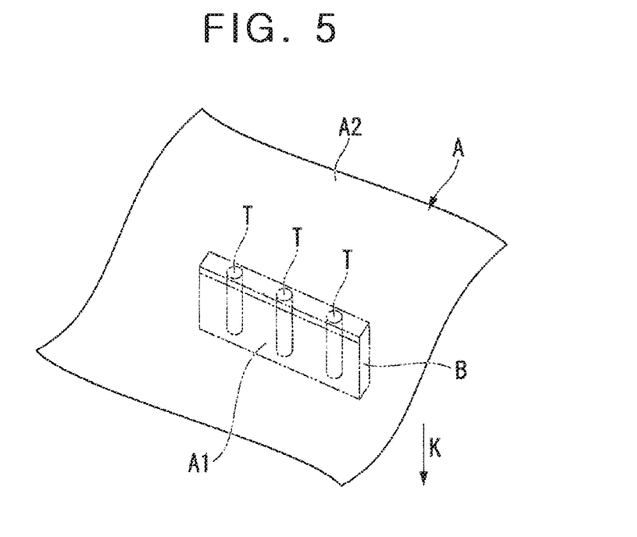
FIG. 5 is an explanatory diagram showing in a stepwise manner a method of burying trenches of a sample of the present invention.

Next, as shown in FIG. 5, a position where the sample piece Q is produced and extracted, that is, a position including a target cross section A1 to be observed is determined in the sample S. In the present embodiment, one surface of a small area including the trenches T extending along the depth direction K of the sample S is defined as the target cross section A1. First, on the basis of operation of an operator, the computer 21 activates the electron beam irradiation optical system 15 and scans the electron beam EB onto one surface A2 of the sample S on the stage 12. The secondary electrons R are generated from the one surface A2 by irradiating the sample S with the electron beam EB and are detected by the secondary electron detector 16.

Then, the computer 21 generates image data from the output of the secondary electron detector 16 and displays the image data on the display device 20. The operator confirms the image and determines the position including the target cross section A1.

Incidentally, when the position of the target cross section A1 to be observed has been determined in advance in the sample S, the position information and the image information can be stored in the computer 21. In such case, the position including the target cross section A1 may be automatically determined under the control of the computer 21.

Figure 6:
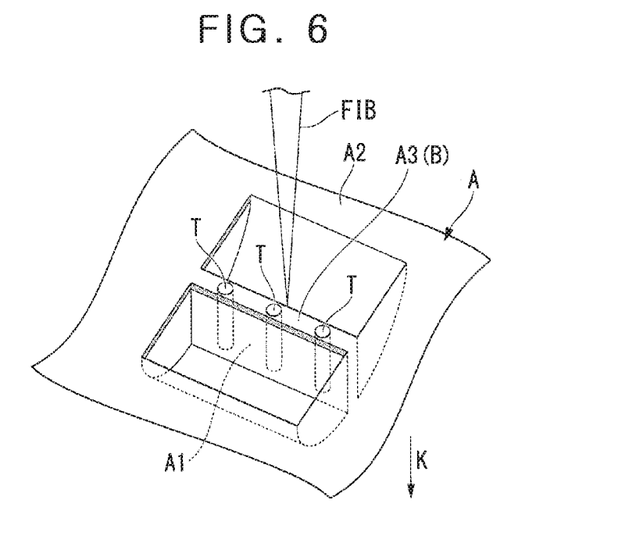
FIG. 6 is an explanatory diagram showing in a stepwise manner a method of burying trenches of a sample of the present invention.

Next, a focused ion beam FIB is irradiated to the position including the target cross section A1 to form a thin piece section A3 including trenches T in the sample S. More specifically, as shown in FIG. 6, on the basis of the operation of the operator, the computer 21 activates the focused ion beam irradiation optical system 14 and irradiates the focused ion beam FIB from the side of the one surface A2 to the sample S. Thereby, in the sample S, the periphery of the target cross section A1 is etched, whereby a thin piece portion A3 having the thickness and width of the sample piece Q to be produced and including the target cross section A1 is formed.

Here, on a surface including the target cross section A1 formed on the thin piece portion A3, streaks are formed by irradiation of the focused ion beam FIB. Further, an image is acquired by the electron beam irradiation optical system 15 and the secondary electron detector 16 as needed, and the state of the sample S is confirmed. That is the same in the following steps. Also in this step, the thin piece portion A3 may be formed by automatically irradiating the focused ion beam FIB under the control of the computer 21 on the basis of the predetermined position information, dimensions of a sample piece Q to be produced, and the like.

Figure 7:
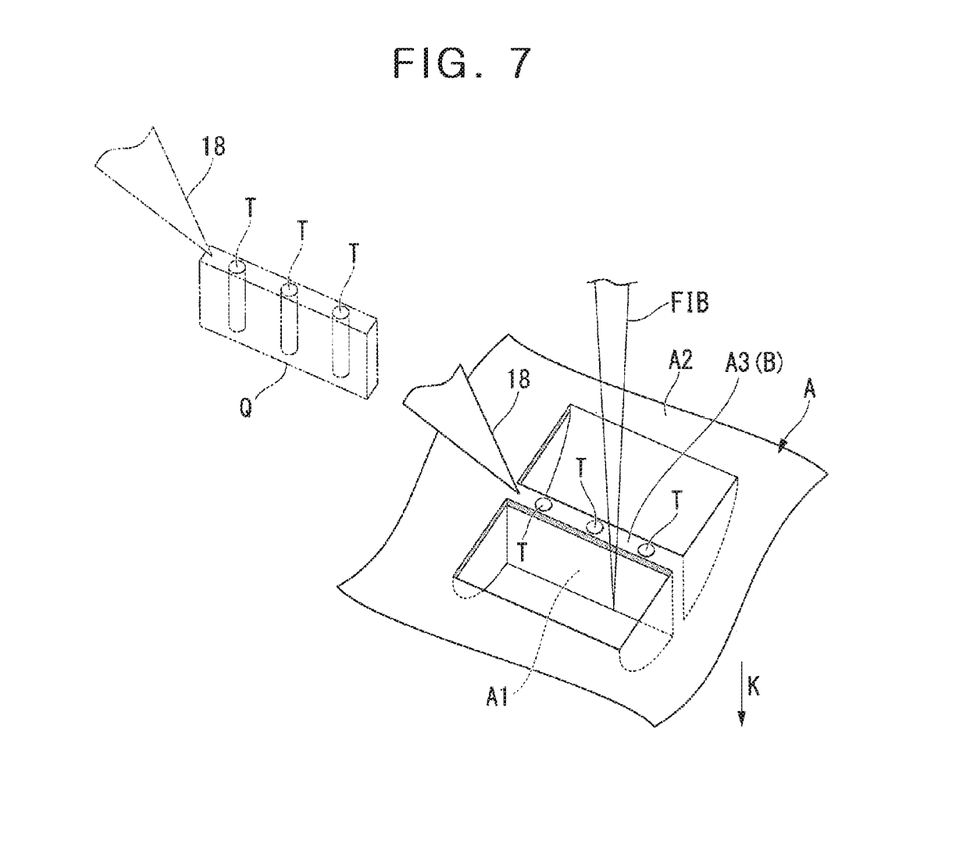
FIG. 7 is an explanatory diagram showing in a stepwise manner a method of burying trenches of a sample of the present invention.

Next, the formed thin piece portion A3 is extracted as a sample piece Q (cutting step). More specifically, as shown in FIG. 7, first, under the operation by the operator, the computer 21 drives the needle driving mechanism 19 to move the needle 18 of the needle driving mechanism 19 to the thin piece portion A3. Then, the needle 18 is bonded to the thin piece portion A3 on the side of the one surface A2 of the sample S, for example, by inclining the axis of the needle 18 with regard to the one surface A2 from an oblique upper side.

When bonding the needle 18 to the thin piece portion A3, the compound gas G from the gas supply unit 17 is supplied to the thin piece portion A3 and the tip surface of the needle 18 while the focused ion beam FIB is irradiated. Thereby, the thin piece portion A3 and the needle 18 are connected by a deposition film formed by decomposition of the compound gas G.

Next, the focused ion beam irradiation optical system 14 is operated again, and a focused ion beam FIB is irradiated and etching is performed to the edge portion of the thin piece portion A3 where the thin piece portion A3 and the main body of the sample S are connected to each other. As a result, the thin piece portion A3 is separated from the main body portion of the sample S and extracted by the needle driving mechanism 19 as a sample piece Q. Also in the present step, the needle driving mechanism 19 and the focused ion beam irradiation optical system 14 may be automatically operated under the control of the computer 21 to extract the sample piece Q.

Next, the needle driving mechanism 19 is operated to move the sample piece Q held by the needle 18 to a processing position for burying trenches T. The processing position for burying trenches T is, for example, a position which is capable of making the focused ion beam FIB to be irradiated from the focused ion beam irradiation optical system 14 incident at a right angle with regard to the target cross section A1 (a side extending along the depth direction K of the sample piece Q) and which is capable of making the compound gas G injected from the nozzle 17a of the gas supply unit 17 fill the inside of the trenches T from the openings To on the side of the one surface A2 of the trenches T.

Next, a step for burying trenches T formed in the sample piece Q is performed (deposition step). In this deposition step, the electron beam EB is irradiated from the electron beam irradiation optical system 15 such that the electron beam EB is incident at a right angle to the target cross section A1 that is the side extending along the depth direction K of the sample piece Q (see FIG. 8). At this time, an acceleration voltage of the electron beam EB is adjusted in accordance with a distance α (See FIG. 9) from the target cross section (side surface) A1 of the sample piece Q to an inner wall surface Ta of the trench T and the electron beam EB is penetrated into the inner wall surface Ta of the trench T (i.e., the inside of the trench T).

Figure 8:
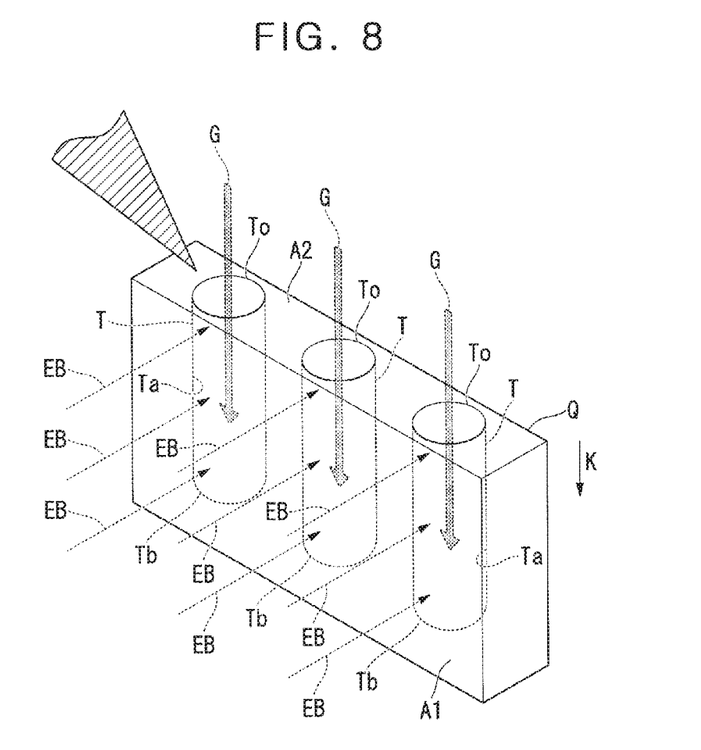
FIG. 8 is an explanatory diagram showing in a stepwise manner a method of burying trenches of a sample of the present invention.

Further, the electron beam EB is transmitted to the inside of the trench T and at the same time the compound gas G from the nozzle 17a is injected from the openings To on the side of the one surface A2 of the sample piece Q toward the inside of the trench Ta. As a result, the inside of the trench T is filled with the compound gas G.

Figure 9:
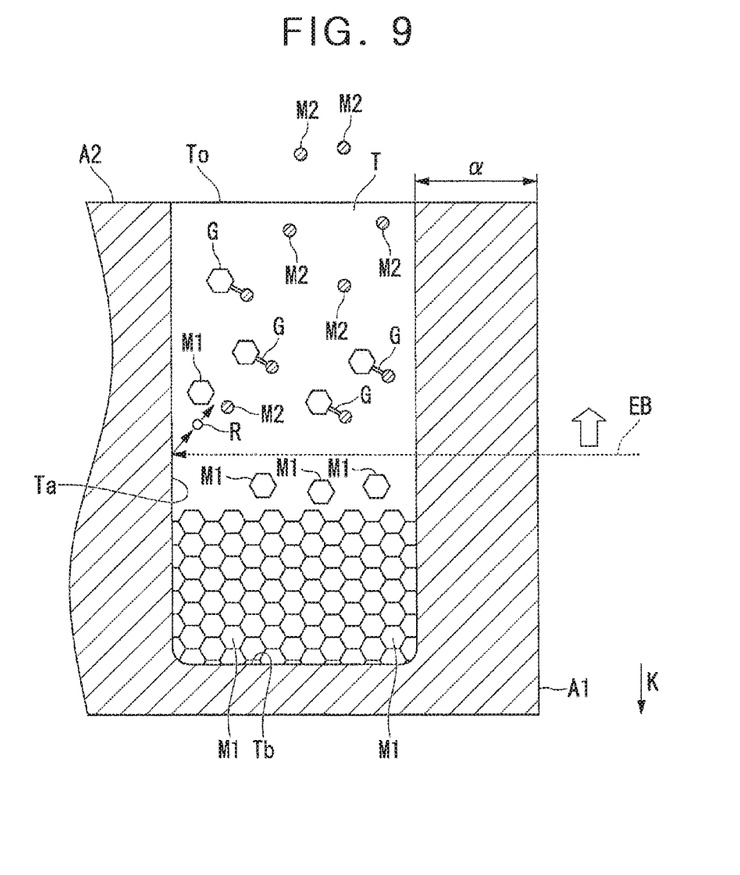
FIG. 9 is an explanatory diagram showing in a stepwise manner a method of burying trenches of a sample of the present invention.

As shown in FIG. 9, when the electron beam EB is transmitted through the target cross section (side surface) A1 and is incident on the inner wall surface Ta of the trench T, the secondary electrons R are generated. When the secondary electrons R impinge on the compound gas G filling the inside of the trenches T, the compound gas G is decomposed into, for example, solid constituents (solid components) M1 and gaseous bodies (gas components) M2. Then, the solid constituents (solid components) M1 are deposited within the trenches T. On the other hand, the gas bodies (gas components) M2 are discharged to the outside of the sample chamber 11 by an exhaust device (not shown) for evacuating the sample chamber 11 to a vacuum state.

As described above, the compound gas G is decomposed by the secondary electrons R generated in the trenches T by irradiation of the electron beam EB, and the constituents (solid components) M1 of the decomposed products are deposited within the trenches T. Accordingly, the trenches T can be buried with the constituent (solid component) M1. Here, though not shown, scattered electrons are generated in the inner wall surface Ta by irradiation of the electron beam EB, and secondary electrons are generated also by the scattered electrons. These secondary electrons also contribute to the deposition.

In this deposition step, the irradiation position of the electron beam EB is scanned from the bottom portion Tb of the trenches T toward the openings To so that the constituents (solid components) are sequentially deposited from the bottom portion Tb toward the openings To. As a result, it is possible to prevent the unevenness in the deposition of the constituents (solid components) M1 such as the constituents (solid components) M1 first adhering to the vicinity of the openings To before the bottom portion Tb of the trenches T and then the openings To being closed to cause cavities within the inside of the trenches T. Therefore, it becomes possible to uniformly bury the trenches T with the constituents (solid components) M1 without causing cavities within the trenches T.

Further, in this deposition step, the acceleration voltage of the electron beam EB by the electron beam irradiation optical system 15 is varied in accordance with the distance α from the target cross section (side surface) A1 of the sample piece Q to the inner wall surface Ta of the trench T. By appropriately adjusting the acceleration voltage of the electron beam EB, for example, even when a plurality of trenches T exist or when a thickness that is the distance α between the target cross section (side surface) A1 and the inner wall face Ta of the trench T is thick, it is possible to reliably transmit the electron beam EB toward the inside of a target trench T.

In addition, in the depositing step, in addition to burying the entire inside of the trench T from the bottom portion Tb to the opening To with the constituents (solid components), the range of burying may be adjusted such that it is buried with the constituents (solid components) from the bottom portion Tb of the trench T to a certain height range, for example, about half of the depth of the trench T.

In the present embodiment, the electron beam EB is incident at a right angle to the target cross section (side surface) A1 of the sample piece Q. However, the incident angle of the electron beam EB with respect to the target cross section (side surface) A1 is not limited to a right angle. The electron beam EB may be incident on the target cross section (side surface) A1 of the sample piece Q at any incident angle if the electron beam EB can reach the inner wall surface Ta of the trench T.

Next, after the sample piece Q is placed on the sample piece holder P, for example, deposition on a contact portion between the sample piece holder P and the sample piece Q is performed, and the sample pieces Q is bonded to the sample piece holder P. Thereafter, the needle 18 and the sample piece Q are cut.

Next, the target cross section A1 included in the sample piece (Q) is subjected to finish processing. For example, the focused ion beam irradiation optical system 14 is operated, and a focused ion beam (FIB) is irradiated to the target cross section (side surface) A1 of the sample piece Q fixed to the sample piece holder P. Thus, a sample piece Q having a good target cross section (side surface) A1 can be produced by removing streaks generated when the thin piece portion A3 (see FIG. 6) is formed.

By burying the trench T with the constituents (solid components) beforehand in the preceding step in the finish processing of the target cross section A1, it is possible to prevent damages by the finishing processing, for example, amorphization or curtain effect. Thereby, the target cross section A1 can be made an excellent observation surface free from damages.

The sample piece Q obtained through the above steps is cut by etching with the sample piece Q fixed to the sample piece holder P or the part of the sample piece Q bonded to the sample piece holder P is cut by etching and is newly fixed to a carrying holder (not shown). Thereafter, it is conveyed to a transmission electron microscope, and cross-sectional observation is carried out.

Although the embodiments of the present invention have been described, these embodiments are presented as examples and are not intended to limit the scope of the invention. These embodiments can be implemented in various other forms, and various omissions, substitutions, and alterations can be made without departing from the gist of the invention. These embodiments and their modifications fall within the scope of the invention as defined in the claims and equivalents thereof as well as the scope and spirit of the invention.

REFERENCE NUMERALS LIST

10: charged particle beam apparatus
11: sample chamber
12: stage (sample stage)
13: stage driving mechanism
14: focused ion beam irradiation optical system
15: electron beam irradiation optical system
16: detector
17: gas supply unit
18: needle
19: needle driving mechanism
20: display unit
P: sample piece holder,
Q: sample piece
R: secondary electron
S: sample

What is claimed is:

1. A method of burying a trench of a sample comprising at least the steps of:
   from the sample having the trench extending from one surface of the sample into a depth direction of the sample and having an opening on the one surface of the sample, cutting a sample piece of a small part including the trench in order that the trench has an inner wall surface; and
   by irradiating an electron beam toward the inside of the trench and to the inner wall surface of the trench from a side surface extending along the depth direction of the sample piece and at the same time injecting a compound gas into the inside of the trench from the opening, decomposing the compound gas with secondary electrons generated by irradiation of the electron beam to the inner wall surface of the trench and depositing constituents of the compound gas within the trench.

2. The method of burying a trench of a sample according to claim 1,
   wherein in said depositing step, the constituents of the compound gas are sequentially deposited toward the opening from the bottom of the trench by scanning the electron beam toward the openings from the bottom of the trench.

3. The method of burying a trench of a sample according to claim 1,
   wherein in said depositing step, an acceleration voltage of the electron beam is varied in accordance with a distance from the side surface of the sample piece to the inner wall surface of the trench.

* * * * *